United States Patent
Ohba et al.

(10) Patent No.: US 9,419,214 B2
(45) Date of Patent: Aug. 16, 2016

(54) TARGET, METHOD FOR PRODUCING THE SAME, MEMORY, AND METHOD FOR PRODUCING THE SAME

(71) Applicant: Sony Corporation, Tokyo (JP)

(72) Inventors: Kazuhiro Ohba, Miyagi (JP); Yuichi Kamori, Miyagi (JP); Hitoshi Kimura, Miyagi (JP)

(73) Assignee: SONY CORPORATION, Tokyo (JP)

( * ) Notice: Subject to any disclaimer, the term of this patent is extended or adjusted under 35 U.S.C. 154(b) by 207 days.

(21) Appl. No.: 14/174,917

(22) Filed: Feb. 7, 2014

(65) Prior Publication Data

US 2014/0151624 A1  Jun. 5, 2014

Related U.S. Application Data

(62) Division of application No. 12/838,524, filed on Jul. 19, 2010, now abandoned.

(30) Foreign Application Priority Data

Jul. 28, 2009  (JP) .................................. 2009-175709

(51) Int. Cl.
| | | |
|---|---|---|
| B22F 9/04 | (2006.01) | |
| H01L 45/00 | (2006.01) | |
| C22C 1/05 | (2006.01) | |
| C23C 14/34 | (2006.01) | |
| C23C 14/14 | (2006.01) | |

(52) U.S. Cl.
CPC . *H01L 45/08* (2013.01); *B22F 9/04* (2013.01); *C22C 1/05* (2013.01); *C23C 14/14* (2013.01); *C23C 14/3414* (2013.01); *H01L 45/085* (2013.01); *H01L 45/1233* (2013.01); *H01L 45/1266* (2013.01); *H01L 45/145* (2013.01); *H01L 45/146* (2013.01); *H01L 45/1625* (2013.01); *Y10T 428/31678* (2015.04)

(58) Field of Classification Search
None
See application file for complete search history.

(56) References Cited

U.S. PATENT DOCUMENTS

| | | | |
|---|---|---|---|
| 2005/0041372 A1* | 2/2005 | Omori | C22C 27/02 361/508 |
| 2007/0039817 A1 | 2/2007 | Daniels et al. | |
| 2007/0053786 A1* | 3/2007 | Nonaka | C23C 14/14 420/579 |

FOREIGN PATENT DOCUMENTS

| | | |
|---|---|---|
| JP | 2002-536840 | 10/2002 |
| JP | 2003-115580 | 4/2003 |
| JP | 2004-130541 | 4/2004 |
| JP | 2005-117002 | 4/2005 |
| JP | 2005-290404 | 10/2005 |
| JP | 2005-302264 | 10/2005 |
| JP | 2009-043757 | 2/2009 |
| JP | 2009-043758 | 2/2009 |
| JP | 2009-043873 | 2/2009 |
| JP | 2009-268083 | 11/2009 |
| JP | 2011-026679 | 2/2011 |
| WO | WO/00/48196 | 8/2000 |

OTHER PUBLICATIONS

Japanese Office Action issued in connection with counterpart Japanese Patent Application No. 2009-175709 dated Jun. 18, 2013.
Japanese Office Examination issued in connection with related Japanese patent application No. 2013-194087 dated Jun. 17, 2014.
Japanese Office Examination Report issued in connection with related Japanese patent application No. JP 2013-194087 dated Sep. 2, 2014.
Korean Patent Office Action corresponding to KR Serial No. 10-2010-0068403 dated Apr. 26, 2016.

* cited by examiner

*Primary Examiner* — George Wyszomierski
*Assistant Examiner* — Ngoclan T Mai
(74) *Attorney, Agent, or Firm* — Dentons US LLP

(57) ABSTRACT

A target including: at least one refractory metal element selected from the group consisting of Ti, Zr, Hf, V, Nb, Ta, and lanthanoids; at least one element selected from the group consisting of Al, Ge, Zn, Co, Cu, Ni, Fe, Si, Mg, and Ga; and at least one chalcogen element selected from the group consisting of S, Se, and Te. And a method for producing the target.

5 Claims, 2 Drawing Sheets

TARGET, METHOD FOR PRODUCING THE SAME, MEMORY, AND METHOD FOR PRODUCING THE SAME

RELATED APPLICATION DATA

This application is a division of U.S. patent application Ser. No. 12/838,524 filed Jul. 19, 2010, the entirety of which is incorporated herein by reference to the extent permitted by law. The present application claims the benefit of priority to Japanese Patent Application No. JP 2009-175709 filed on Jul. 28, 2009 in the Japan Patent Office, the entirety of which is incorporated by reference herein to the extent permitted by law.

BACKGROUND OF THE INVENTION

1. Field of the Invention

The present invention relates to a target containing a refractory metal element and a chalcogen element and to a method for producing the same. The invention also relates to a memory including a memory device having an ionization layer formed using a target and to a method for producing the same.

2. Description of the Related Art

A high-speed, high-density DRAM has been widely used as a random access memory in an information-processing apparatus, such as a computer.

However, DRAMs are volatile memories that lose their contents when the power is turned off, and the written information (data) has to be frequently refreshed, i.e., the data needs to be frequently read, reamplified, and rewritten.

As non-volatile memories that do not lose their contents when the power is turned off, a flash memory, an FeRAM (ferroelectric random-access memory), an MRAM (magnetic memory device), and the like have been proposed, for example.

These memories are capable of maintaining the written information for a long period of time without power supply.

Further, because these memories are non-volatile, they do not require refreshment, and the power consumption can be reduced accordingly.

Therefore, various non-volatile memories as those mentioned above have been widely studied and commercially developed.

However, such non-volatile memories have both merits and demerits.

Flash memories have high integration density, but are disadvantageous in terms of operation speed.

FeRAMs pose a limitation on the microprocessing for high integration, and also have problems in the production process.

MRAMs have problems in terms of power consumption.

Accordingly, a new type of memory device has been proposed, which is particularly advantageous to overcome the limitation on the microprocessing of a memory device.

This memory device has a structure in which an ion conductor containing a specific metal is sandwiched between two electrodes. When a voltage is applied between the two electrodes, the metal in each electrode diffuses as ions into the ion conductor, thereby changing the resistance, capacitance, or like electrical characteristics of the ion conductor.

A memory device can be configured to utilize such characteristics.

Specifically, the ion conductor includes a solid solution of chalcogen elements (S, Se, Te) and a metal. More specifically, the ion conductor includes a material having Ag, Cu, and Zn dissolved in AsS, GeS, and GeSe (see, e.g., JP-T-2002-536840 (the term "JP-T" as used herein means a published Japanese translation of a PCT patent application)).

It has also been proposed that a layer of such an ion conductor (hereinafter referred to as an ionization layer) contains, in addition to the chalcogen elements, Zr, Al, and like elements (see, e.g., JP-A-2009-43758).

SUMMARY OF THE INVENTION

The ionization layer of a memory device can be formed using a plurality of targets by co-sputtering or by periodically stacking layers of the constituent elements with a thickness of about 1 nm.

However, in order to improve the uniformity of composition of ionization layers and reduce the variation among wafers, it is preferable that the ionization layers are formed using one target.

Incidentally, the ionization layer of a memory device may have the following configuration: element M1-element M2-chalcogen element. In this configuration, elements are classified according to their melting points. Elements M1 are refractory metals including Ti, Zr, Hf, V, Nb, Ta, and the like. Elements M2 include Cu, Al, Si, Ge, Mg, Ga, and the like, for example, and chalcogen elements include S, Se, and Te.

Among these elements, an element M1 (refractory metal element) often has a melting point higher than or close to the boiling point of a chalcogen element. Accordingly, it is difficult to simultaneously dissolve the constituent elements, and it thus is difficult to form a target by a dissolution method.

Meanwhile, when forming a target by a powder sintering method, because powders of some elements M1, e.g., Ti, Zr, and Hf, are highly ignitable, there is a danger of ignition during sintering, and it thus is also difficult to perform sintering using such power materials.

In the production of a target with a larger diameter, these problems are more significant. Therefore, it has been difficult to obtain a large target.

Accordingly, it is desirable to provide a target that contains a refractory metal element and can be produced with less risk of ignition and a method for producing the same. It is also desirable to provide a memory that includes a memory device formed using the target and a method for producing the same.

According to an embodiment of the invention, there is provided a target containing at least one refractory metal element selected from the group consisting of Ti, Zr, Hf, V, Nb, Ta, and lanthanoids and at least one element selected from the group consisting of Al, Ge, Zn, Co, Cu, Ni, Fe, Si, Mg, and Ga. The target further contains at least one chalcogen element selected the group consisting of S, Se, and Te.

According to another embodiment of the invention, there is provided a method for producing a target containing a chalcogen element. The method includes the step of forming an alloy ingot using at least one refractory metal element selected from the group consisting of Ti, Zr, Hf, V, Nb, Ta, and lanthanoids and an additional element outside of the group, and also includes the step of pulverizing the alloy ingot. The method further includes the step of forming a target using the pulverized alloy ingot and at least one chalcogen element selected from the group consisting of S, Se, and Te.

According to still another embodiment of the invention, there is provided a memory including a plurality of memory devices. The memory devices are formed using a target and have an ionization layer containing an element to be ionized.

The target used contains at least one refractory metal element selected from the group consisting of Ti, Zr, Hf, V, Nb, Ta, and lanthanoids and at least one element selected from the group consisting of Al, Ge, Zn, Co, Cu, Ni, Fe, Si, Mg, and Ga. The target also contains at least one chalcogen element selected the group consisting of S, Se, and Te.

That is, the memory according to this embodiment is configured such that the ionization layer of the memory devices is formed using the target according to the above embodiment.

According to still yet another embodiment of the invention, there is provided a method for producing a memory including a plurality of memory devices. The method includes the step of forming an alloy ingot using at least one refractory metal element selected from the group consisting of Ti, Zr, Hf, V, Nb, Ta, and lanthanoids and an additional element outside of the group, and also includes the step of pulverizing the alloy ingot. The method further includes the step of forming a target using the pulverized alloy ingot and a chalcogen element, and the step of forming an ionization layer of the memory devices by sputtering using the alloy target, the ionization layer containing an element to be ionized.

That is, the method for producing a memory according to this embodiment applies the method for producing a target according to the above embodiment, and uses a target produced by such a method to form the ionization layer of each memory device.

The target according to the above embodiment contains a refractory metal element, at least one element selected from the group consisting of Al, Ge, Zn, Co, Cu, Ni, Fe, Si, Mg, and Ga, and a chalcogen element. Therefore, a novel target containing these elements can be achieved.

This makes it possible to form a layer containing these elements by sputtering using only one target.

The method for producing a target according to the above embodiment includes the step of forming an alloy ingot using a refractory metal element and an additional element outside of the group of refractory metal elements, followed by the step of pulverizing the alloy ingot. As a result, with respect to a refractory metal element that is highly ignitable in the form of a powder, such an element can be used as a powder material for sintering with less risk of ignition. In addition, because the melting point of the alloy ingot is lower than the melting point of the refractory metal element, the difference from the melting point of the chalcogen element is reduced.

Further, owing to the step of forming a target using the pulverized alloy ingot and at least one chalcogen element selected from the group consisting of S, Se, and Te, a target containing a refractory metal element and a chalcogen element can be produced with less risk of ignition at the time of sintering.

The memory according to the above embodiment is configured such that the ionization layer of the memory devices is formed using the target according to the embodiment of the invention. Therefore, an ionization layer containing a refractory metal element can be formed using only one target.

The method for producing a memory according to the above embodiment applies the method for producing a target according to the embodiment of the invention, and uses a target produced by such a method to form the ionization layer of memory devices. As a result, the target containing a refractory metal element and a chalcogen element can be produced with less risk of ignition at the time of pulverization or sintering, and the use of such a target allows an ionization layer containing a refractory metal element to be formed using only one target.

The target according to the above embodiment makes it possible to form a layer containing a refractory metal element, a chalcogen element, and an additional metal element by sputtering using only one target. A heretofore non-existing, novel target can thus be achieved.

The method for producing a target according to the above embodiment of the invention allows a target containing a refractory metal element and a chalcogen element to be formed with less risk of ignition at the time of pulverization or sintering.

Accordingly, even a large target having a diameter of 100 mm or more can be produced with less danger of ignition.

Therefore, a target can be increased in size to correspond to the increased size of a wafer, making it possible to form a film on a large-diameter wafer.

Further, the memory and the method for producing the same according to the above embodiments allow the ionization layer of the memory devices forming the memory, which contains a refractory metal element, to be formed using only one target.

As a result, as compared with the case of using a plurality of targets as in co-sputtering, the number of cathodes in a film formation apparatus for forming an ionization layer of memory devices can be reduced. Therefore, the production apparatus can be simplified, significantly increasing the throughput.

Further, the variation in composition or thickness among wafers, which is often observed in the case of co-sputtering or periodical stacking, can also be reduced.

DESCRIPTION OF THE PREFERRED EMBODIMENTS

Figure 1:
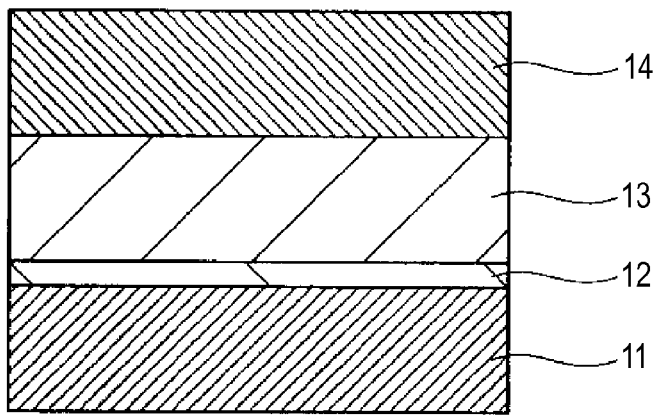
FIG. 1 is a schematic cross-section of a memory device that forms a memory according to an embodiment of the invention.

Hereinafter, preferred embodiments for implementing the invention (hereinafter referred to as embodiments) will be explained.

Explanations will be given in the following order.
1. Overview of the Invention
2. Embodiments of Memory Device and Memory
3. Experimental Examples

1. OVERVIEW OF THE INVENTION

First, before describing specific embodiments and experimental examples of the invention, an overview of the invention will be given.

A target according to an embodiment of the invention contains a refractory metal element, an additional element (metal element) that is not a refractory metal element, and a chalcogen element.

The refractory metal element is at least one refractory metal element selected from the group consisting of Ti, Zr, Hf, V, Nb, Ta, and lanthanoids (Ln) (group of elements M1).

The additional element (metal element) that is not a refractory metal element is at least one element selected from the group consisting of Al, Ge, Zn, Co, Cu, Ni, Fe, Si, Mg, and Ga (group of element M2).

The chalcogen element is at least one chalcogen element selected the group consisting of S, Se, and Te.

Such a target containing these three kinds of elements is heretofore unknown, and a novel target can thus be realized.

A layer containing the three kinds of elements can thus be formed by sputtering using one target, and, therefore, as compared with sputtering using a plurality of targets, the layer can be provided with a more stable composition.

A method for producing a target according to an embodiment of the invention is a method for producing a target containing a chalcogen element, and includes the following steps:

(1) Step of forming an alloy ingot using at least one refractory metal element selected from the group consisting of Ti, Zr, Hf, V, Nb, Ta, and lanthanoids (group of elements M1) and an additional element outside of the group;

(2) Step of pulverizing the alloy ingot; and (3) Step of forming a target using the pulverized alloy ingot and at least one chalcogen element selected from the group consisting of S, Se, and Te.

The method for producing a target according to the embodiment includes the step (1) of forming an alloy ingot and the step (2) of pulverizing the alloy ingot. As a result, a refractory metal element that is highly ignitable in the form of a powder can be used as a powder with less risk of ignition. In addition, because the melting point of the alloy ingot is lower than the melting point of the refractory metal element, the difference from the melting point of the chalcogen element is reduced.

Further, owing to the step (3) of forming a target using the pulverized alloy ingot and a chalcogen element, a target containing a refractory metal element and a chalcogen element can be produced with less risk of ignition at the time of sintering.

Accordingly, even a large target having a diameter of 100 mm or more can be produced with less danger of ignition.

Therefore, a target can be increased in size to correspond to the increased size of a wafer, making it possible to form a film on a large-diameter wafer.

In the step (1) of forming an alloy ingot, it is preferable that the refractory metal element that serves as a raw material is a material with a particle diameter of 100 μm or more. As a result, the danger of ignition can be further reduced.

In the step (1) of forming an alloy ingot, it is preferable that the additional element outside of the group of refractory metal elements is at least one element selected from the group consisting of Al, Ge, Zn, Co, Cu, Ni, Fe, Si, Mg, and Ga (group of elements M2). As a result, the melting point of the alloy ingot can be sufficiently lower than the melting point of the refractory metal element, reducing the difference from the melting point of the chalcogen element. This facilitates the formation of a target containing a refractory metal element and a chalcogen element.

It is more preferable that the method for producing a target further includes the following steps:

(4) Step of alloying an chalcogen element and at least one additional element that is not a chalcogen element to form a second alloy ingot containing a chalcogen element; and (5) Step of pulverizing the second alloy ingot.

The step (3) of forming a target is performed using the alloy ingot pulverized in the step (2) and the second alloy ingot pulverized in the step (5).

In the step (4) of forming a second alloy ingot, it is preferable that the second alloy ingot has a melting point higher than the melting point of the chalcogen element. This facilitates sintering in the production of the second alloy ingot and thus is advantageous.

Further, in the step (4) of forming a second alloy ingot, the additional element that is not a chalcogen element may be at least one element selected from the group consisting of Al, Ge, Zn, Co, Cu, Ni, Fe, Si, Mg, and Ga (group of elements M2). As a result, a target containing a refractory metal element, an element of the group of elements M2, and a chalcogen element, i.e., the target according to the above embodiment, can be formed eventually.

A memory according to an embodiment of the invention is a memory including a plurality of memory devices. The memory devices have an ionization layer containing an element to be ionized.

Further, the ionization layer of the memory devices is formed using the target according to the above embodiment.

This makes it possible to form an ionization layer containing a refractory metal element using only one target.

A method for producing a memory according to an embodiment of the invention applies the method for producing a target according to the above embodiment to the production of a memory including a plurality of memory devices, and uses a target produced by such a method to form an ionization layer of the memory devices.

As a result, a target containing a refractory metal element and a chalcogen element can be produced with less risk of ignition at the time of pulverization or sintering, and the use of such a target allows an ionization layer containing a refractory metal element to be formed using only one target.

Further, the memory and the method for producing the same according to the embodiments of the invention allow the ionization layer to be formed using only one target, and, therefore, as compared with the case of using a plurality of targets as in co-sputtering, the number of cathodes in a film formation apparatus for forming the ionization layer can be reduced.

Accordingly, the production apparatus can be simplified, significantly increasing the throughput.

Further, the variation in composition or thickness among wafers, which is often observed in the case of co-sputtering or periodical stacking, can also be reduced.

The memory according to the embodiment of the invention has an ionization layer formed using the target according to the embodiment of the invention. Accordingly, the formed ionization layer contains the same elements as the target, i.e., a refractory metal element (element of the group of elements M1), an additional metal element that is not a refractory metal element (element of the group of elements M2), and a chalcogen element.

Of these elements forming the ionization layer, the chalcogen element serves as an ion conductive material to give negative ions.

Further, among refractory metal elements (elements of the group of elements M1), the group 4A transition metal elements Ti, Zr, and Hf and the group 5A transition metal elements V, Nb, and Ta are ionized to give positive ions. They are reduced on the electrode, forming a conduction path in the metallic state (filament). Cu and like elements of the group of elements M2 also form a conduction path in the metallic state (filament).

The ionization layer is provided with a lower electrode and an upper electrode. A voltage is applied through these electrodes to the ionization layer of memory devices to thereby change the resistance of the ionization layer. Using the resistance state of the ionization layer, information can be recorded and retained in each memory device.

Recording of information on memory devices is performed briefly as follows.

When a positive voltage is applied to a memory device in a high-resistance state, the metal elements to be ionized (Ti, Zr, etc.) contained in the ionization layer are ionized to positive ions. The positive ions are transferred in the ionization layer (ionic conduction). They combine with electrons on the electrode side and are deposited thereon to form a low-resistance conduction path (filament) reduced to the metallic state at the interface between the ionization layer and the electrode. As a result, the resistance of the ionization layer of the memory device is reduced, and the initial high-resistance state is changed into a low-resistance state.

Meanwhile, when a negative voltage is applied to the memory device in a low-resistance state, the metal elements in the conduction path are oxidized and ionized. The ions dissolve in the ionization layer or combine with the chalcogen element in the ionization layer, whereby the conduction path disappears. As a result, the resistance of the ionization layer of the memory device is increased, and the low-resistance state is changed into a high-resistance state.

In either case, even when the voltage applied to the memory device is removed after the resistance change, the resistance state of the memory device is retained, so the recorded information can be retained.

2. EMBODIMENTS OF MEMORY DEVICE AND MEMORY

As specific embodiments of the invention, the following describes an embodiment of a memory device that forms a memory and an embodiment of a memory.

FIG. 1 shows a schematic cross-section of a memory device that forms a memory according to an embodiment of the invention.

The memory device 10 includes a high resistance layer 12, an ionization layer 13, and an upper electrode 14 stacked in this order on a lower electrode 11. The lower electrode 11 is formed on a non-illustrated silicon substrate with a CMOS circuit, for example.

Wiring materials for use in semiconductor processes can be used for the lower electrode 11 and the upper electrode 14, examples thereof including TiW, Ti, W, Cu, Al, Mo, Ta, and silicides.

In the case of using an electrode material that may allow ion conduction in the electric field, such as Cu, such a Cu electrode may be covered with a material with less ionic conductivity or less thermal diffusivity, such as W, WN, TiN, TaN, or the like.

Oxides and nitrides are usable for the high resistance layer 12. For example, an oxide containing at least one element selected from the group of rare earth elements including La, Ce, Pr, Nd, Sm, Eu, Gd, Tb, Dy, Ho, Er, Yb, and Y, or Si or Cu is used for the high resistance layer 12.

The high resistance layer 12 has a sufficiently higher resistance than the ionization layer 13.

The high resistance layer 12 is formed thinner than other layers so that the current flowing through the memory device 10 is not too small.

The ionization layer 13 may include an element to be ionized, an element (chalcogen element) selected from Te, Se, and S, and an additional element.

In this embodiment, the ionization layer 13 is configured to include a refractory metal element, an additional element (metal element) that is not a refractory metal element, and a chalcogen element.

The refractory metal element is at least one refractory metal element selected from the group consisting of Ti, Zr, Hf, V, Nb, Ta, and lanthanoids (Ln) (group of elements M1).

The additional element (metal element) that is not a refractory metal element is at least one element selected from the group consisting of Al, Ge, Zn, Co, Cu, Ni, Fe, Si, Mg, and Ga (group of elements M2).

The chalcogen element is at least one chalcogen element selected the group consisting of S, Se, and Te.

Of these elements, the chalcogen element serves as an ion conductive material to give negative ions.

Further, the group 4A transition metal elements Ti, Zr, and Hf, the group 5A transition metal elements V, Nb, and Ta, and Cu of the group of elements M2, for example, are ionized to give positive ions. They are reduced on the electrode, forming a conduction path in the metallic state (filament).

In addition, Al, Ge, Si, and Mg of the group of elements M2, for example, are oxidized at the interface between the ionization layer 13 and the electrode at the time when the resistance state of the memory device changes from low to high, forming a stable oxide film.

The high resistance layer 12 and the ionization layer 13 can be collectively referred to as a "memory layer" for recording and storing information.

The memory device 10 thus configured has such characteristics that the impedance of the memory layer (the high resistance layer 12 and the ionization layer 13) or the impedance of the ionization layer 13 changes in response to the application of a voltage pulse or a current pulse.

Further, in this embodiment, the ionization layer 13 of the memory device 10 is formed using a target containing a refractory metal element, an additional element (metal element) that is not a refractory metal element, and a chalcogen element (i.e., the target according to the above embodiment). As a result, the ionization layer 13 can be formed using only one target, and, therefore, as compared with the case of using a plurality of targets as in co-sputtering, the number of cathodes in a film formation apparatus for forming the ionization layer 13 can be reduced. Therefore, the production apparatus can be simplified, significantly increasing the throughput.

Further, the variation in composition or thickness among wafers, which is often observed in the case of co-sputtering or periodical stacking, can also be reduced.

The memory device 10 of this embodiment can be operated as follows to store information.

First, for example, a positive potential (+potential) is applied to the upper electrode 14 to apply a positive voltage to the memory device 10 so that its lower-electrode-11 side is negative. Ions of the element to be ionized are thus transferred from the ionization layer 13. They combine with electrons on the lower-electrode-11 side and are deposited thereon to form a conduction path in the high resistance layer 12. As a result, the resistance of the high resistance layer 12 is reduced. The resistance of other layers than the high resistance layer 12 is originally lower than that of the high resistance layer 12. Therefore, the reduction in the resistance of the high resistance layer 12 leads to a reduction in the resistance of the entire memory device 10.

Subsequently, the positive voltage is removed to eliminate the voltage on the memory device 10, whereby the resistance in the low state is retained. Information can thus be recorded. In the application to a memory device that can be written only once, so-called PROM, recording is completed in such a recording process.

Meanwhile, an erase process is necessary in the application to a memory device whose content can be erased, so-called RAM or EEPROM.

In the erase process, for example, a negative potential (−potential) is applied to the upper electrode 14 to apply a negative voltage to the memory device 10 so that its lowerelectrode-11 side is positive. The element in the conduction path formed in the high resistance layer 12 is thus oxidized and ionized. They dissolve in the ionization layer 13 or combine with the chalcogen element in the ionization layer 13 to produce a compound.

As a result, the conduction path disappears from the high resistance layer 12 or decreases, whereby the resistance of the high resistance layer 12 increases. The resistance of other layers than the high resistance layer 12 is originally low, and, therefore, the increase in the resistance of the high resistance layer 12 leads to an increase in the resistance of the entire memory device 10.

Subsequently, the negative voltage is removed to eliminate the voltage on the memory device 10, whereby the resistance in the high state is retained. The recorded information can thus be erased.

By repeating these processes, information can be repeatedly recorded (written) on and erased from the memory device 10.

For example, provided that the high-resistance state and the low-resistance state correspond to the information "0" and "1", respectively, the information can be changed from "0" to "1" during the information recording process by the application of a positive voltage, while the information can be changed from "1" to "0" during the information erasing process by the application of a negative voltage.

The resistance after recording depends on the recording conditions including the width of the voltage pulse or the current pulse applied for recording, the amount of current, etc., rather than on the cell size of the memory device 10 and the material composition of the high resistance layer 12. When the initial resistance is 100 kΩ or more, the resistance after recording is within a range of about 50Ω to about 50 kΩ.

When the initial resistance is twice or more the resistance after recording, this is sufficient to recover the recorded data. Therefore, it is sufficient that the resistance before recording is 100Ω and the resistance after recording is 50Ω, or that the resistance before recording is 100 kΩ and the resistance after recording is 50 kΩ, for example. The initial resistance of the high resistance layer 12 is determined to satisfy such conditions.

The resistance of the high resistance layer 12 can be controlled by the amount of oxygen contained in the oxide of the high resistance layer 12 before heating, the thickness of the oxide film, etc., for example.

The memory device 10 is configured such that the high resistance layer 12 and the ionization layer 13 are sandwiched between the lower electrode 11 and the upper electrode 14. Accordingly, when a positive voltage (+potential) is applied to the upper electrode 14 so that the lower-electrode-11 side is negative, a conduction path containing a large amount of ionized element is formed in the high resistance layer 12. This reduces the resistance of the high resistance layer 12, leading to a reduction in the resistance of the entire memory device 10. When the application of a positive voltage is stopped so that no voltage is applied to the memory device 10, the resistance in the low state is retained, whereby information can be recorded.

Further, when a negative voltage (−potential) is applied to the upper electrode 14 of such a memory device 10 after recording so that the lower-electrode-11 side is positive, the conduction path formed in the high resistance layer 12 disappears. This increases the resistance of the high resistance layer 12, leading to an increase in the resistance of the entire memory device 10. When the application of a negative voltage is stopped so that no voltage is applied to the memory device 10, the resistance in the high state is retained, whereby the recorded information can be erased.

Using memory devices 10 configured as above, a memory (memory device) can be formed by arranging a large number of memory devices 10 in a linear fashion or in a matrix.

In each memory device 10, for example, a wire is connected to its lower-electrode-11 side, and another wire is connected to its upper electrode 14 side, so that each memory device 10 is placed near the intersection of these wires.

In addition, if necessary, a MOS transistor for selecting a memory device or a diode is connected to each memory device 10; a memory cell is thus configured. Each memory device 10 is further connected via wires to a sense amplifier, an address recorder, record/erase/read circuits, etc.

Memories according to embodiments of the invention are applicable to various memories.

Examples thereof include a PROM (programmable ROM) that can be written only once, an EEPROM (Electrically Erasable ROM) that can be erased electrically, and a RAM (random access memory) that can be read, erased, and reproduced at high speed.

Although the high resistance layer 12 is in contact with the ionization layer 13 in the above embodiment, a high resistance layer is not essential in a memory device that forms a memory according to an embodiment of the invention, and a configuration with no high resistance layer is also possible.

When the high resistance layer 12 is in contact with the ionization layer 13 as in the above embodiment, this further stabilizes the information-retaining properties and thus is advantageous.

3. EXPERIMENTAL EXAMPLES

A target was actually produced, and a memory including memory devices was produced using the target.

With respect to the memory, the characteristics of its memory devices were examined.

Example 1

First, using a 1-mm$^3$ Zr scrap as a Zr raw material of the group of refractory metal elements M1, 1-cm$^3$ Al pellets and a 3-cm$^2$ Cu thin plat as raw materials of the group of elements M2 were dissolved in a high-frequency melting furnace to prepare an AlCuZr alloy ingot.

Subsequently, the alloy ingot was pulverized in an attritor to prepare an alloy powder with a particle diameter of 106 μm or less.

Subsequently, the alloy powder was mixed with a Te powder with a particle diameter of 75 μm or less and a Ge power with a particle diameter of 32 to 106 μm, and the mixture was sintered to give an AlCuGeTeZr target base material.

The target base material was then cut into a disc-like piece with a thickness of 5 mm and a diameter of 300 mm to give a target.

The prepared target was adhered to the backing plate of a sputtering apparatus using In wax.

Subsequently, a Gd oxide film with a thickness of 2 nm was formed as a high resistance layer 12 on a CMOS circuit provided with a lower electrode 11 formed of a W (tungsten) layer.

Then, using the above-prepared target, an AlCuGeTeZr layer with a thickness of about 60 nm was formed as an ionization layer 13.

Further, a W layer with a thickness of 50 nm was formed thereon as an upper electrode 14, thereby forming a memory device 10 having a cross section as shown in FIG. 1.

In this manner, a memory cell array having a large number of memory devices 10 was formed on a wafer to give a sample of the memory of Example 1.

The operational characteristics of the memory devices forming the memory of the sample of Example 1 were examined. Specifically, the voltage supplied to the memory devices was varied to examine the change in the current or resistance of the memory devices.

Figure 2:
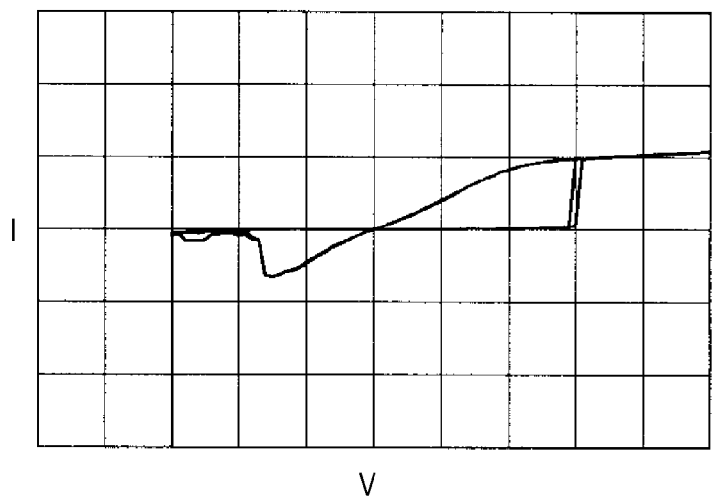
FIG. 2 shows the I-V characteristics of memory devices forming a memory of Example 1.
Figure 3:
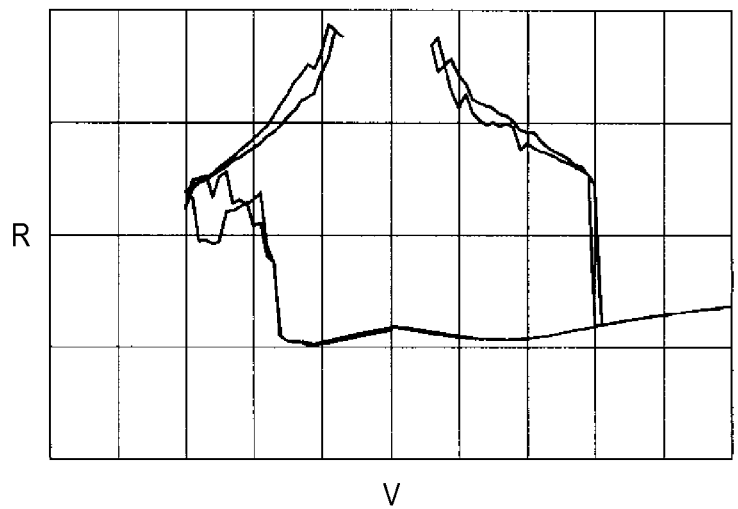
FIG. 3 shows the R-V characteristics of memory devices forming the memory of Example 1.

As the obtained results, FIG. 2 shows the I-V characteristics of the memory devices, and FIG. 3 shows the R-V characteristics of the memory devices.

As shown in FIG. 2 and FIG. 3, the memory devices have an initial resistance as high as about 10 MΩ. However, by negatively biasing the lower-electrode-11 side, the memory devices enter a low-resistance state. Then, by positively biasing the lower-electrode-11 side, the memory devices return to the high-resistance state. This indicates excellent operation of the memory.

Further, a voltage pulse with a voltage Vw of 3 V, a current of about 100 μA, and a pulse width of about 10 ns was applied as a write pulse, while a voltage pulse with a voltage Ve of 2V, and a current of about 100 μA, and a pulse width of about 10 ns was applied as an erase pulse, and 1,000,000 rewrite operations were performed. For every rewrite operation, the resistance of the memory devices in a high-resistance state and a low-resistance state was measured. As the results of measurement, FIG. 4 shows the relation between the number of operations and the resistance of the memory devices.

Figure 4:
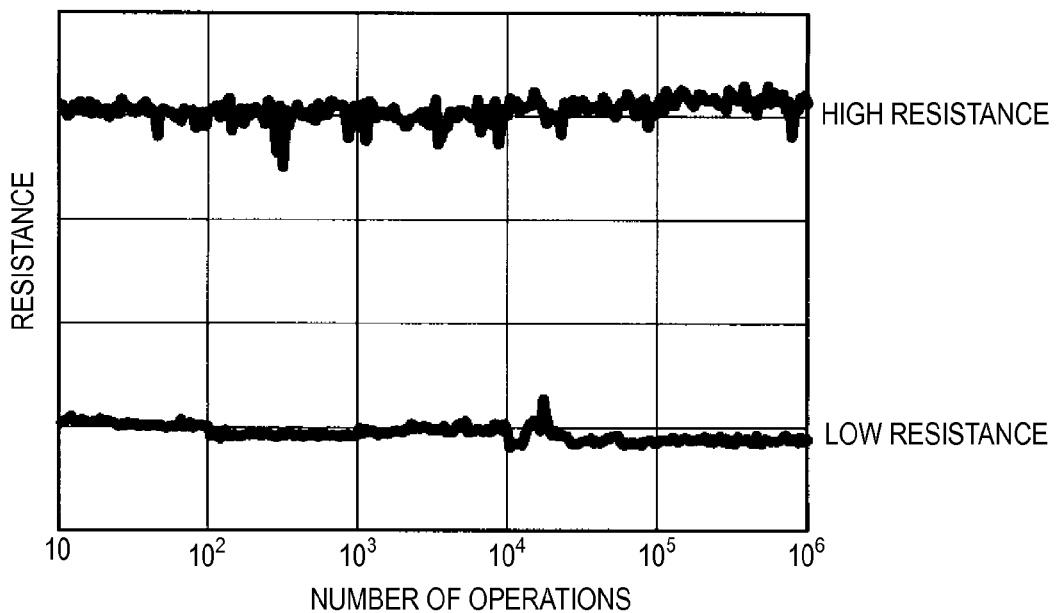
FIG. 4 shows the resistance of memory devices forming the memory of Example 1 at the time of repeated rewriting of the memory devices.

FIG. 4 shows that even when rewriting is repeatedly performed, there is no great change in the resistance values in the high-resistance state and the low-resistance state, indicating excellent operational characteristics. That is, the operational characteristics of the memory were excellent.

Comparative Example 1

In the comparative example, the following materials were used. As a Zr raw material of the group of metal elements M1, a powder with a particle diameter of 106 μm or less was used. As Al, Cu, and Ge raw materials of the group of elements M2, an Al powder with a particle diameter 53 to 106 μm, a Cu powder with a particle diameter of 25 to 35 μm, and a Ge powder with a particle diameter of 32 to 106 μm were used, respectively. Further, using a powder with a particle diameter of 75 μm or less as a Te raw material of the group of chalcogen elements, sintering was performed.

However, the Zr powder reacted with atmospheric oxygen to ignite, so it was impossible to prepare a target base material.

Example 2

Using a 1-mm$^3$ Zr scrap as a Zr raw material of the group of refractory metal elements M1, an Al powder as an Al raw material of the group of elements M2 was mixed and dissolved in a high-frequency melting furnace to prepare an AlZr alloy ingot. The prepared alloy ingot was pulverized to give an alloy powder.

Subsequently, Ge, Cu, and Te raw materials were dissolved in a high-frequency melting furnace to prepare an alloy ingot, which was then pulverized to give an alloy powder.

These two kinds of alloy powders were then mixed at a desired composition ratio, and sintered to give an AlCuGeTeZr target base material.

The target base material was then cut into a disc-like piece with a thickness of 5 mm and a diameter of 300 mm to give a target.

Then, in the same manner as in Example 1, a memory cell array having a large number of memory devices 10 was formed on a wafer to give a sample of the memory of Example 2.

The characteristics of the memory of the sample of Example 2 were evaluated as in Example 1. As a result, the characteristics of the memory were excellent.

Comparative Example 2

In Example 1, the ionization layer 13 of the memory devices 10 was formed using an AlCuGeTeZr alloy target.

However, an ionization layer 13 of memory devices 10 herein was formed by a co-sputtering method, in which four kinds of targets, Al, Zr, Cu, and GeT, were simultaneously discharged. In otherwise the same manner as in Example 1, a memory cell array having a large number of memory devices 10 was formed on a wafer to give a sample of the memory of Comparative Example 2.

(Evaluation of Variation in Initial Resistance)

With respect to the case of Example 1 where an alloy target was used in the film formation and the case of Comparative Example 2 where co-sputtering was employed in the film formation, the initial resistance of the memory devices 10 of the sample of each memory was measured to evaluate the variation.

Specifically, 11 wafers were placed in one cassette. In a film formation apparatus, an ionization layer 13 was formed for the memory devices 10 of each wafer, thereby forming a memory cell array on each wafer. Then, the initial resistance of the memory devices 10 in a 4-kB memory cell array formed near the center of each wafer was measured, and the median of the resistance values was calculated.

Figure 5:
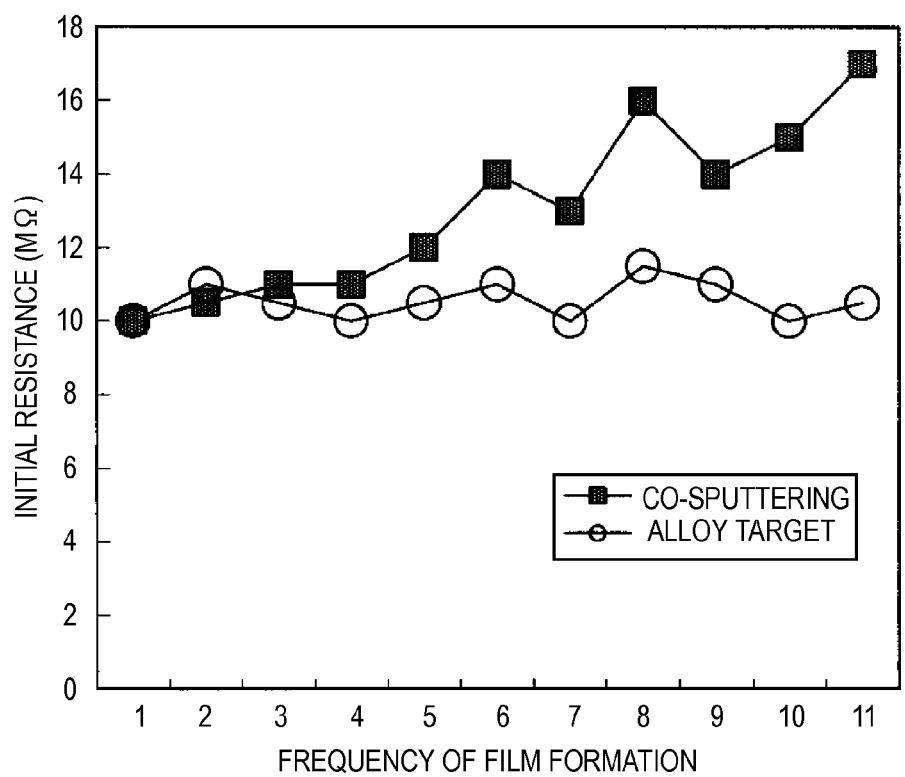
FIG. 5 shows a comparison of the change in the initial resistance of memory devices (median value) between samples of Example 1 and Comparative Example 2.

As the evaluation results, FIG. 5 shows the variation in the initial resistance (median) of memory devices depending on the frequency of film formation, i.e., the number of wafers (1 to 11).

FIG. 5 shows that in the case of Comparative Example 2 where co-sputtering was employed in the film formation, the resistance increases with an increase in the frequency of film formation. Meanwhile, in the case of Example 1 where an alloy target was used in the film formation, the resistance does not greatly vary with an increase in the frequency of film formation.

This will be probably because during the formation of films by co-sputtering, unwanted elements adhere to the surface of the target, causing a change in the film composition.

In contrast, in the case where one alloy target is used, the target used has the same components as those of the film to be formed. Therefore, even when elements adhere to the target, the components thereof are the same as the target components. There thus is only a small influence of adhesion of unwanted elements.

Therefore, forming an ionization layer of a memory using an alloy target results in less change in composition, and thus will be more suitable for mass production.

The invention is not limited to the above embodiments, and various modifications can be made without deviating from the gist of the invention.

The present application contains subject matter related to that disclosed in Japanese Priority Patent Application JP 2009-175709 filed in the Japan Patent Office on Jul. 28, 2009, the entire contents of which is hereby incorporated by reference.

What is claimed is:

1. A method for producing a target containing a chalcogen element, comprising the steps of:

forming an alloy ingot by combining at least one refractory metal element selected from a first group consisting of Ti, Zr, Hf, V, Nb, Ta, and lanthanoids and an additional element outside of the first group and selected from a second group consisting of Al, Ge, Zn, Co, Cu, Ni, Fe, Si, Mg, and Ga;

pulverizing the alloy ingot; and forming a target by combining the pulverized alloy ingot and at least one chalcogen element selected from the group consisting of S, Se, and Te.

2. A method for producing a target according to claim 1, wherein in the step of forming an alloy ingot, a material having a particle diameter of 100 μm or more is used as the at least one refractory metal element that serves as a raw material.

3. A method for producing a target according to claim 1, further comprising the steps of:

alloying the at least one chalcogen element and at least one additional element that is not a chalcogen element to form a second alloy ingot including the at least one chalcogen element; and pulverizing the second alloy ingot, wherein, the step of forming a target is performed using the pulverized alloy ingot and the pulverized second alloy ingot.

4. A method for producing a target according to claim 3, wherein the second alloy ingot has a melting point higher than the melting point of the at least one chalcogen element.

5. A method for producing a target according to claim 3, wherein the second alloy ingot is formed using as the at least one additional element that is not a chalcogen element at least one element selected from the group consisting of Al, Ge, Zn, Co, Cu, Ni, Fe, Si, Mg, and Ga.

* * * * *